US012362278B2

(12) United States Patent
Li et al.

(10) Patent No.: US 12,362,278 B2
(45) Date of Patent: Jul. 15, 2025

(54) TRANSISTORS WITH DUAL POWER AND SIGNAL LINES

(71) Applicant: International Business Machines Corporation, Armonk, NY (US)

(72) Inventors: Tao Li, Slingerlands, NY (US); Ruilong Xie, Niskayuna, NY (US); David Wolpert, Poughkeepsie, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 506 days.

(21) Appl. No.: 17/900,398

(22) Filed: Aug. 31, 2022

(65) Prior Publication Data
US 2024/0071926 A1    Feb. 29, 2024

(51) Int. Cl.
| | | |
|---|---|---|
| *H01L 23/528* | (2006.01) | |
| *H01L 21/822* | (2006.01) | |
| *H01L 21/8238* | (2006.01) | |
| *H01L 27/092* | (2006.01) | |
| *H01L 29/06* | (2006.01) | |

(Continued)

(52) U.S. Cl.
CPC ....... *H01L 23/5286* (2013.01); *H10D 30/014* (2025.01); *H10D 30/031* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 84/0167* (2025.01); *H10D 84/0186* (2025.01); *H10D 84/038* (2025.01); *H10D 84/856* (2025.01); *H10D 88/01* (2025.01)

(58) Field of Classification Search
CPC .......... H01L 23/5286; H10D 30/014; H10D 30/031; H10D 30/43; H10D 30/6729; H10D 30/6735; H10D 30/6757; H10D 62/121; H10D 84/0167; H10D 84/0186; H10D 84/038; H10D 84/856; H10D 88/01; H10D 30/0198; H10D 64/017; H10D 64/251; H10D 62/822; H10D 88/00; B82Y 10/00
USPC ....................................................... 257/351
See application file for complete search history.

(56) References Cited

U.S. PATENT DOCUMENTS

| | | |
|---|---|---|
| 7,705,447 B2 | 4/2010 | Ganesan et al. |
| 10,192,819 B1 | 1/2019 | Chanemougame et al. |

(Continued)

FOREIGN PATENT DOCUMENTS

| | | |
|---|---|---|
| EP | 4030470 A1 | 7/2022 |
| WO | PCT/IB2023/057487 | 10/2023 |

*Primary Examiner* — Tong-Ho Kim
(74) *Attorney, Agent, or Firm* — Kimberly Zillig; Ryan, Mason & Lewis, LLP

(57) ABSTRACT

A semiconductor structure includes a first field-effect transistor having a first back side source/drain contact, a second back side source/drain contact, and a first power line and a first signal line each connected to the first back side source/drain contact and the second back side source/drain contact, respectively. The semiconductor structure further includes a second field-effect transistor vertically stacked above the first field-effect transistor. The second field-effect transistor having a first front side source/drain contact, a second front side source/drain contact, and a first power line and a first signal line each connected to the first front side source/drain contact and the second front side source/drain contact, respectively.

20 Claims, 15 Drawing Sheets

(51) Int. Cl.
*H01L 29/417* (2006.01)
*H01L 29/423* (2006.01)
*H01L 29/66* (2006.01)
*H01L 29/775* (2006.01)
*H01L 29/786* (2006.01)
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)
*H10D 84/85* (2025.01)
*H10D 88/00* (2025.01)

(56) References Cited

U.S. PATENT DOCUMENTS

| | | |
|---|---|---|
| 10,304,832 B1 | 5/2019 | Chanemougame et al. |
| 10,418,449 B2 | 9/2019 | Paul et al. |
| 10,586,765 B2 | 3/2020 | Smith et al. |
| 11,121,086 B2 | 9/2021 | Hiblot et al. |
| 11,205,620 B2 | 12/2021 | Naser et al. |
| 2018/0145030 A1 | 5/2018 | Beyne et al. |
| 2020/0373241 A1 | 11/2020 | Gerousis et al. |
| 2021/0305262 A1 | 9/2021 | Wang et al. |
| 2021/0305278 A1* | 9/2021 | Shiraki ................. H10D 84/038 |
| 2021/0343332 A1 | 11/2021 | Chiu et al. |
| 2021/0358848 A1 | 11/2021 | Wu et al. |
| 2021/0358891 A1* | 11/2021 | Chuang ................. H01L 25/18 |
| 2021/0366906 A1 | 11/2021 | Huang et al. |
| 2022/0123023 A1* | 4/2022 | Peng ..................... H10D 86/441 |
| 2023/0402379 A1 | 12/2023 | Li et al. |

* cited by examiner

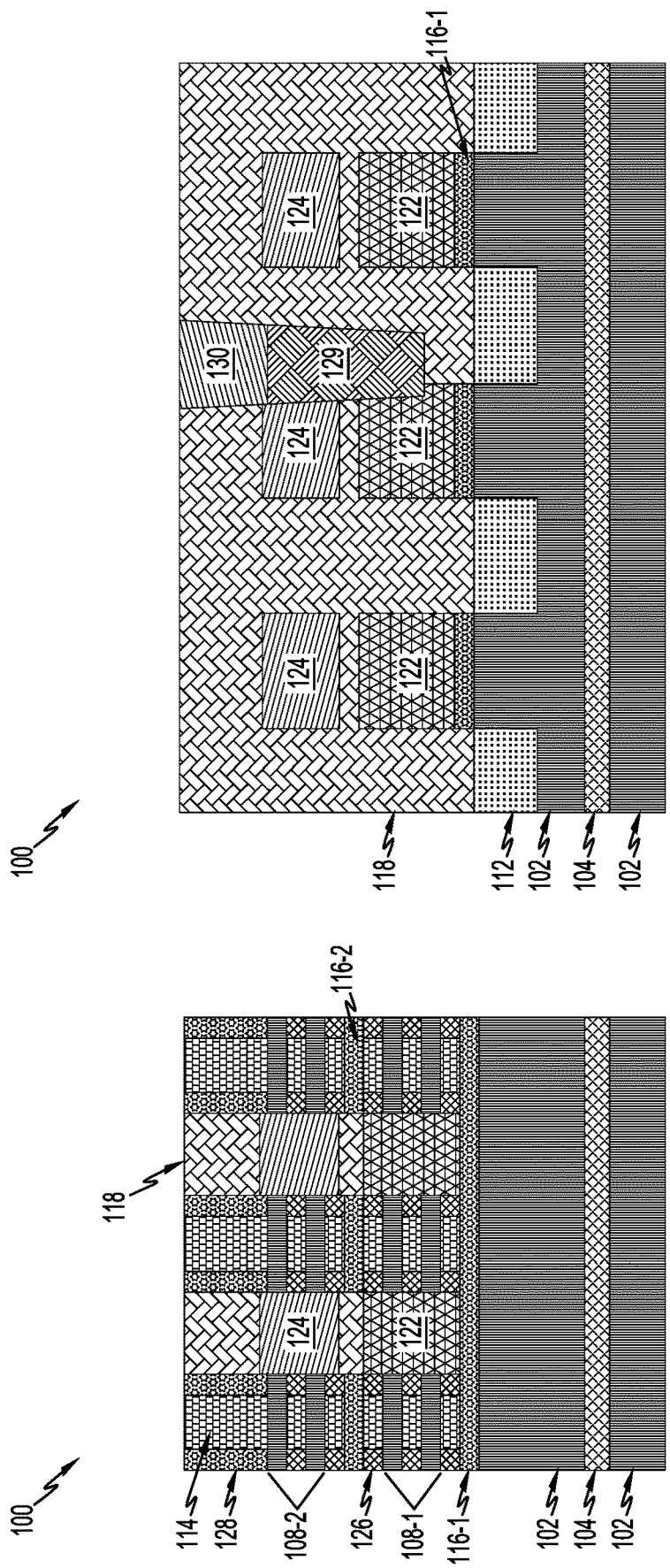

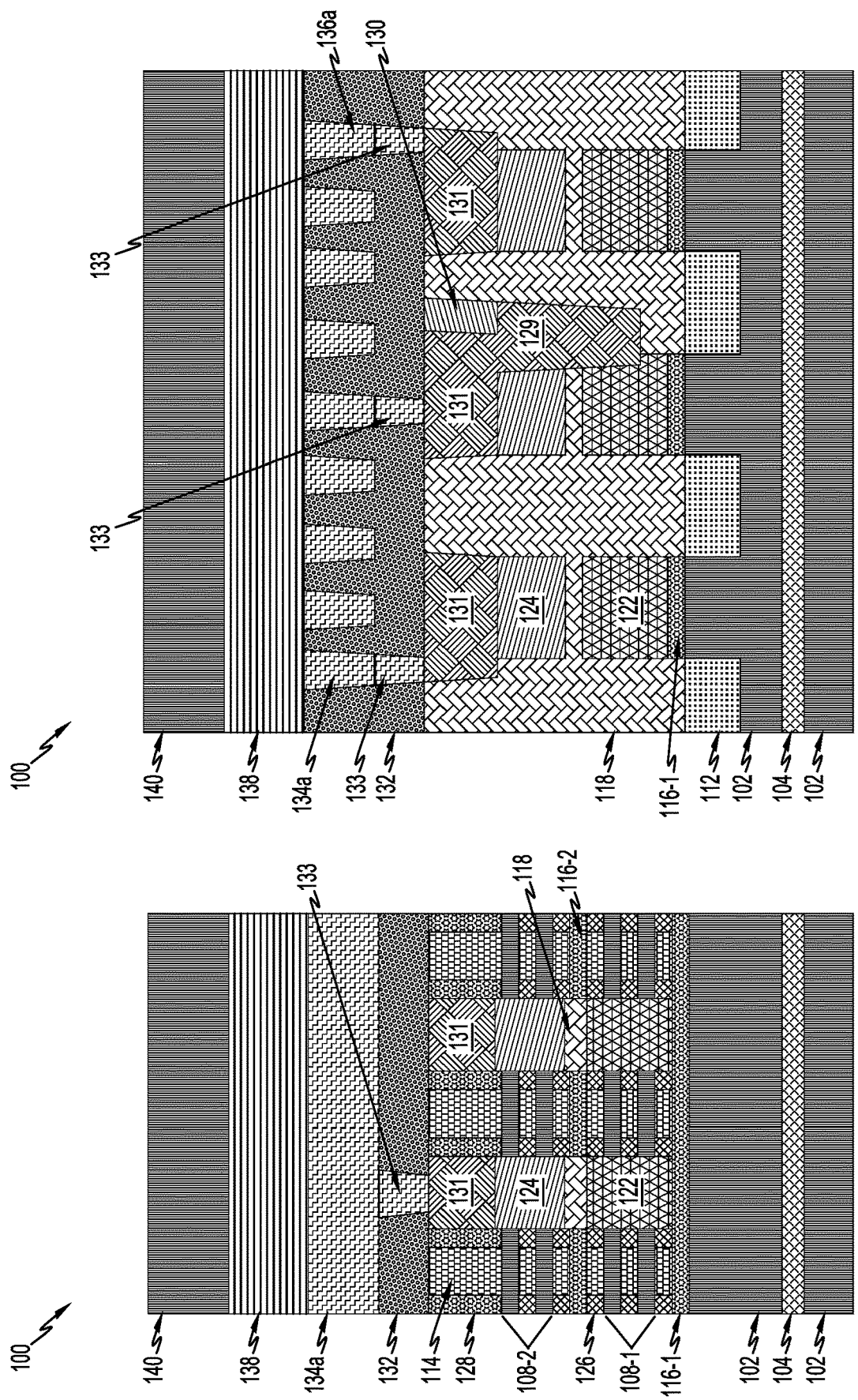

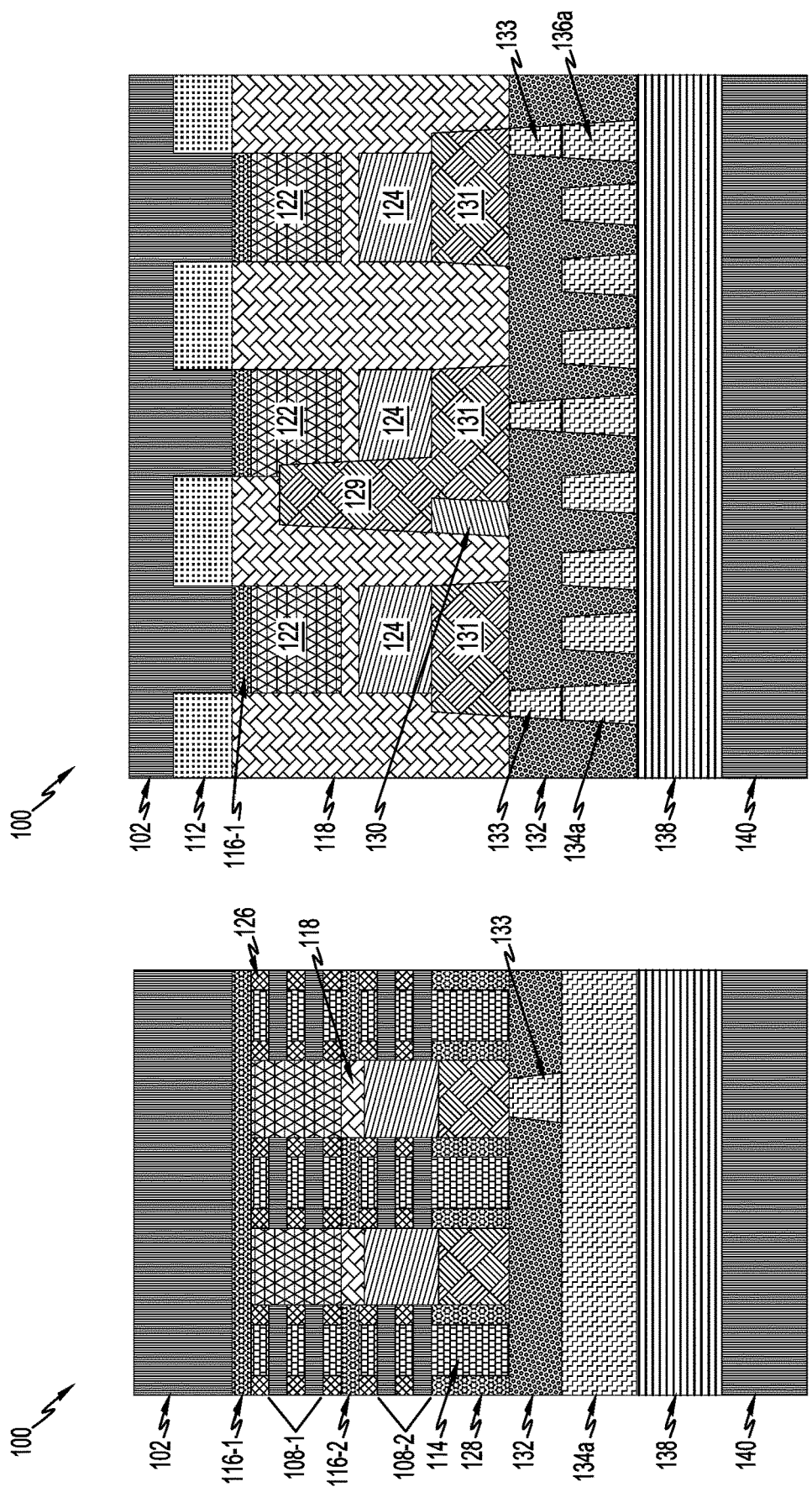

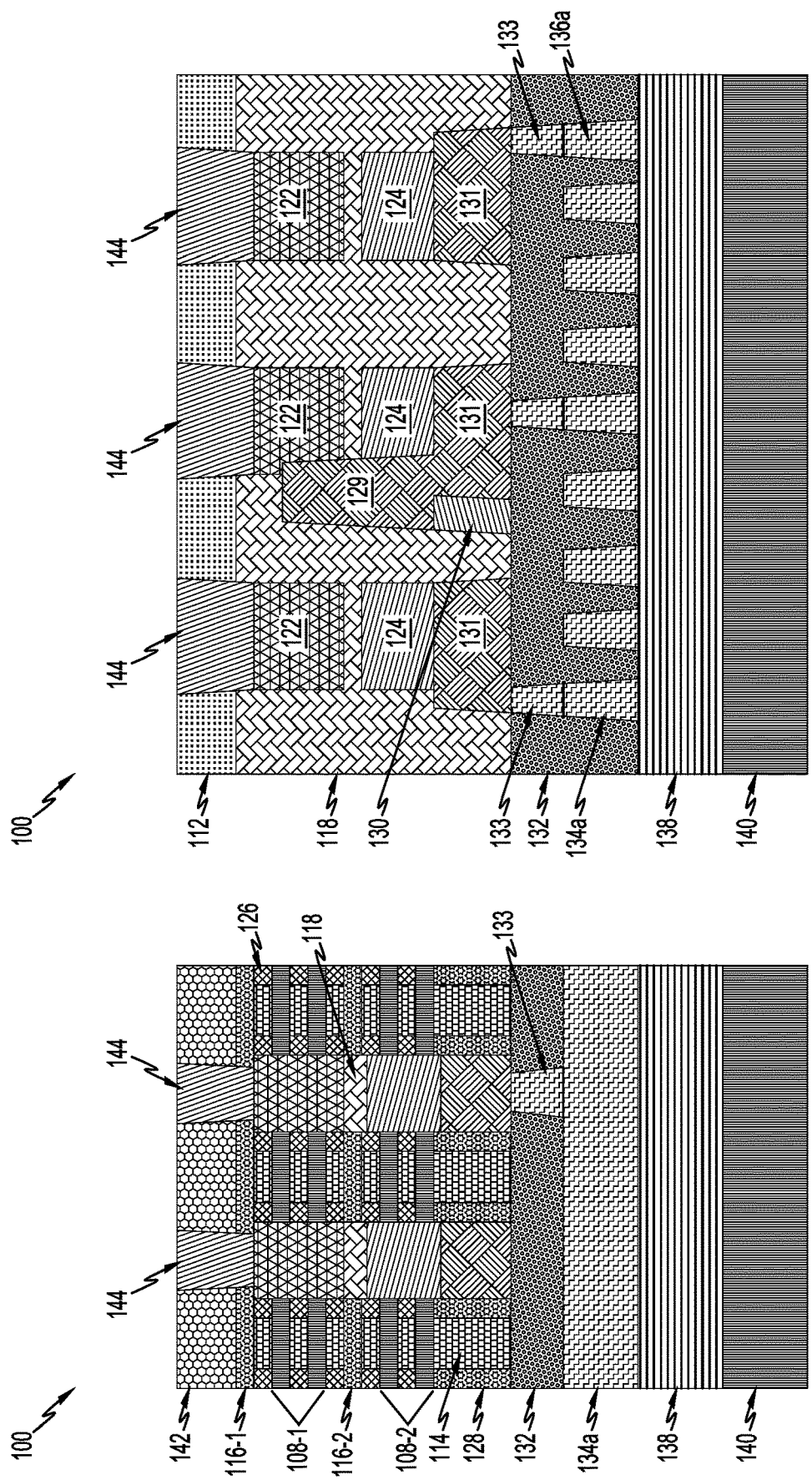

TRANSISTORS WITH DUAL POWER AND SIGNAL LINES

BACKGROUND

A field-effect transistor (FET) is a transistor having a source, a gate, and a drain, the operation of which depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

Illustrative embodiments of the present application include techniques for use in semiconductor manufacture. In an illustrative embodiment, a semiconductor structure comprises a first field-effect transistor comprising a first back side source/drain contact, a second back side source/drain contact, and a first power line and a first signal line each connected to the first back side source/drain contact and the second back side source/drain contact, respectively. The semiconductor structure further comprises a second field-effect transistor vertically stacked above the first field-effect transistor. The second field-effect transistor comprises a first front side source/drain contact, a second front side source/drain contact, and a first power line and a first signal line each connected to the first front side source/drain contact and the second front side source/drain contact, respectively.

The semiconductor structure of the illustrative embodiment advantageously allows for a power line and a signal line at both the front side and the back side of the stacked FETs thereby reducing process complexity and improving routing congestion.

In one or more additional illustrative embodiments, as may be combined with the preceding paragraphs, the first field-effect transistor further comprises a first source/drain region disposed on the first back side source/drain contact and a second source/drain region disposed on the second back side source/drain contact. The second field-effect transistor further comprises a first source/drain region disposed on the first front side source/drain contact and a second source/drain region disposed on the second front side source/drain contact. The first source/drain region of the second field-effect transistor is stacked above the first source/drain region of the first field-effect transistor. The second source/drain region of the second field-effect transistor is stacked above the second source/drain region of the first field-effect transistor.

In one or more additional illustrative embodiments, as may be combined with the preceding paragraphs, the first field-effect transistor further comprises a third source/drain region. The second field-effect transistor further comprises a third source/drain region. The third source/drain region of the second field-effect transistor is stacked above the third source/drain region of the first field-effect transistor.

In one or more additional illustrative embodiments, as may be combined with the preceding paragraphs, the semiconductor structure further comprises a metal contact disposed on each of the third source/drain region of the second field-effect transistor and the third source/drain region of the first field-effect transistor.

In one or more additional illustrative embodiments, as may be combined with the preceding paragraphs, the first power line and the first signal line of the first field-effect transistor are disposed within a first dielectric layer.

In one or more additional illustrative embodiments, as may be combined with the preceding paragraphs, the first power line and the first signal line of the second field-effect transistor are disposed within a second dielectric layer.

In one or more additional illustrative embodiments, as may be combined with the preceding paragraphs, the first field-effect transistor further comprises a back-end-of-line layer on a back side and the second field-effect transistor further comprises a back-end-of-line layer on a front side.

In one or more additional illustrative embodiments, as may be combined with the preceding paragraphs, the first field-effect transistor further comprises a second power line and a second signal line each connected to the back-end-of-line layer on the back side. The second field-effect transistor further comprises a second power line and a second signal line each connected to the back-end-of-line layer on the front side. The second power line of the first field-effect transistor is connected to the second power line of the second field-effect transistor by a first interconnect structure. The second signal line of the first field-effect transistor is connected to the second signal line of the second field-effect transistor by a second interconnect structure.

In one or more additional illustrative embodiments, as may be combined with the preceding paragraphs, the first field-effect transistor and the second field-effect transistor comprise respective nanosheet field-effect transistor devices.

Another exemplary embodiment comprises an integrated circuit comprising one or more semiconductor devices. At least one of the one or more semiconductor devices is a semiconductor device according to one or more of the foregoing illustrative embodiments.

The integrated circuit of the illustrative embodiment advantageously allows for semiconductor structures having a power line and a signal line at both the front side and the back side of the stacked FETs thereby reducing process complexity and improving routing congestion.

In a further exemplary embodiment, a method comprises forming a first field-effect transistor comprising a first back side source/drain contact, a second back side source/drain contact, and a first power line and a first signal line each connected to the first back side source/drain contact and the second back side source/drain contact, respectively. The method further comprises forming a second field-effect transistor vertically stacked above the first field-effect transistor. The second field-effect transistor comprises a first front side source/drain contact, a second front side source/drain contact, and a first power line and a first signal line each connected to the first front side source/drain contact and the second front side source/drain contact, respectively.

The method of the illustrative embodiment advantageously allows for formation of a power line and a signal line at both the front side and the back side of the stacked FETs thereby reducing process complexity and improving routing congestion.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which:

FIG. 2A is a cross-sectional view of the semiconductor structure taken along the X-X axis of FIG. 1A at a second-intermediate fabrication stage, according to an illustrative embodiment.

FIG. 2B is a cross-sectional view of the semiconductor structure taken along the Y-Y axis of FIG. 1A at the second-intermediate fabrication stage, according to an illustrative embodiment.

FIG. 5A is a cross-sectional view illustrating the semiconductor structure taken along the X-X axis of FIG. 1A at a fifth-intermediate fabrication stage, according to an illustrative embodiment.

FIG. 5B is a cross-sectional view illustrating the semiconductor structure taken along the Y-Y axis of FIG. 1A at the fifth-intermediate fabrication stage, according to an illustrative embodiment.

FIG. 8A is a cross-sectional view of the semiconductor structure taken along the X-X axis of FIG. 1A at an eighth-intermediate fabrication stage, according to an illustrative embodiment.

FIG. 8B is a cross-sectional view of the semiconductor structure taken along the Y-Y axis of FIG. 1A at the eighth-intermediate fabrication stage, according to an illustrative embodiment.

FIG. 11A is a cross-sectional view illustrating the semiconductor structure taken along the X-X axis of FIG. 1A at an eleventh-intermediate fabrication stage, according to an illustrative embodiment.

FIG. 11B is a cross-sectional view illustrating the semiconductor structure taken along the Y-Y axis of FIG. 8A at the eleventh-intermediate fabrication stage, according to an illustrative embodiment.

DETAILED DESCRIPTION

Figure 1A:
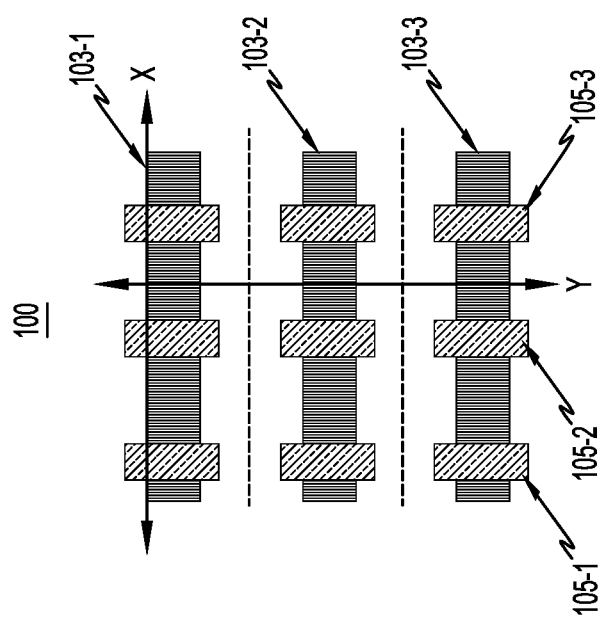
FIG. 1A is a top view illustrating a semiconductor structure for use at a first-intermediate fabrication stage, according to an illustrative embodiment.

Illustrative embodiments of the invention may be described herein in the context of illustrative methods for forming a dual side signal line and power line in stacked device structures to prevent routing congestion and reduce process complexity, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Present stacked FETs connect the signal line of the bottom source/drain region to the BEOL of the wafer front side through an interlevel via, which results in process complexity and routing congestion. There is a need therefore to form stacked FETs without the above drawbacks. Accordingly, non-limiting illustrative embodiments described herein overcome the drawbacks discussed above, by having a power line and a signal line at both the front side and the back side of the stacked FETs thereby reducing process complexity and improving routing congestion.

Figure 1C:
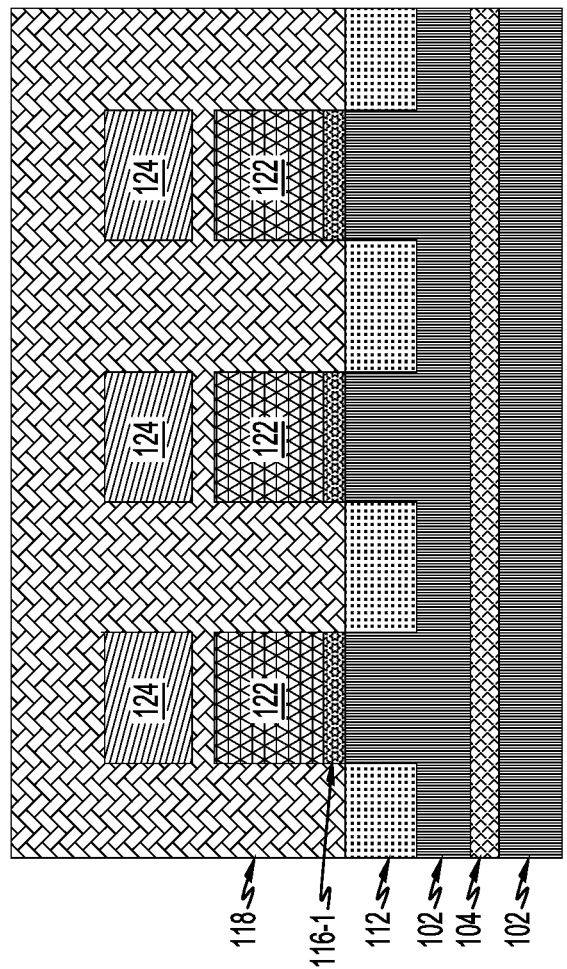
FIG. 1C is a cross-sectional view of the semiconductor structure taken along the Y-Y axis of FIG. 1A at the first-intermediate fabrication stage, according to an illustrative embodiment.
Figure 1B:
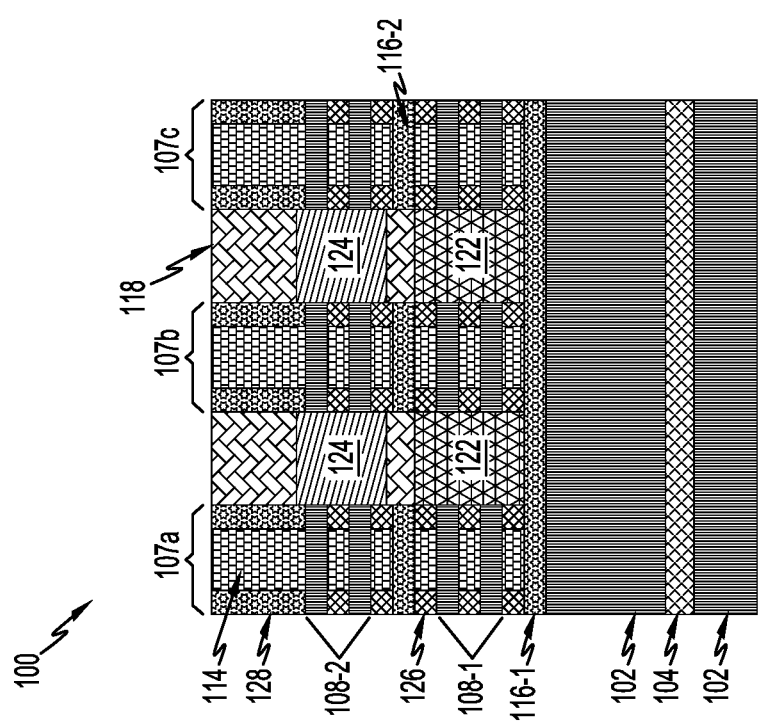
FIG. 1B is a cross-sectional view of the semiconductor structure taken along the X-X axis of FIG. 1A at the first-intermediate fabrication stage, according to an illustrative embodiment.

Illustrative embodiments provide methods and structures for enabling a signal and power line at both the front side and the back side of the stacked FETs. Referring now to FIG. 1A-14, FIG. 1A shows a top-down view of a semiconductor structure 100 where gate structures 105-1, 105-2 and 105-3 will be formed. A first side cross-sectional view of FIG. 1B is taken along the line X-X in the top-down view of FIG. 1A (e.g., across the gate structures 105-1, 105-2 and 105-3), and a second side cross-sectional view of FIG. 1C is taken along the line Y-Y in the top-down view of FIG. 1A (e.g., across the fins 103-1, 103-2 and 103-3).

Semiconductor structure 100 shows substrate 102. Substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

An etch stop layer 104 is formed in the substrate 102. The etch stop layer 104 may comprise a buried oxide (BOX) layer or silicon germanium (SiGe), or another suitable material such as a III-V semiconductor epitaxial layer.

Nanosheets are initially formed over the substrate 102, where the nanosheets include sacrificial layers (not shown), nanosheet channel layers 108-1 and 108-2 (collectively, nanosheet channel layers 108). The sacrificial layers are illustratively formed of different sacrificial materials, such that they may be etched or otherwise removed selective to one another. In some embodiments, the sacrificial layers are formed of SiGe, but with different percentages of Ge. For example, certain ones of the sacrificial layers may have a relatively higher percentage of Ge (e.g., 55% Ge), and other ones of the sacrificial layers may have a relatively lower percentage of Ge (e.g., 25% Ge). Other combinations of different sacrificial materials may be used in other embodiments. The nanosheet channel layers 108 may be formed of Si or another suitable material (e.g., a material similar to that used for the substrate 102).

The nanosheets are then patterned for formation of STI regions 112 and FET stacks 102A, 102B and 102C. The STI regions 112 may be formed of a dielectric material such as silicon dioxide ($SiO_2$), silicon oxycarbide (SiOC), silicon oxynitride (SiON), etc. Each of FET stacks 107A, 107B and 107C contain a first FET device and a second FET device. However, this is merely illustrative and it is contemplated that FET stacks 107A, 107B and 107C can contain any number of FET devices. The FET devices may comprise one of an nFET device or a pFET device and other ones of the FET devices may comprise one of a pFET device and an nFET device.

The FET stacks 107A, 107B and 107C includes a gate stack layer 114, a bottom dielectric insulator (BDI) layer 116-1, a middle dielectric insulator (MDI) layer 116-2, an interlayer dielectric layer (ILD) layer 118, bottom source/drain regions 122, top source/drain regions 124, inner spacers 126, and sidewall spacers 128. To form the structure shown in FIGS. 1B and 1C, dummy gates are first formed over the nanosheets. Next, the sacrificial layers (not shown) are selectively removed, followed by formation of sidewall spacers 128, MDI layer 116-2, and BDI layer 116-1 by conformal dielectric liner deposition and anisotropic dielectric liner etching. After that, the exposed nanosheet stack and portions of the MDI layer 116-2 that are not covered by the dummy gates or sidewall spacers 128 are recessed, followed by indentation of the sacrificial layers and formation of inner spacers 126. Next, the bottom source/drain regions 122, top source/drain regions 124 and ILD layer 118 are formed, followed by poly open CMP to reveal the dummy gates. The dummy gates and sacrificial layers are removed, followed by formation of the gate stack layer 114 (e.g., using replacement HKMG processing).

The gate stack layer 114 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 3 nm.

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The BDI layer 116-1 and MDI layer 116-2 (collectively, dielectric insulator layers 116) may be formed of any suitable insulator, such as SiN, silicon boron carbide nitride (SiBCN), silicon oxycarbonitride (SiOCN), etc. The BDI layer 116-1 is formed in the region previously occupied by a sacrificial layer, and the MDI layer 116-2 is formed in the region previously occupied by another sacrificial layer, and may have similar sizing as the sacrificial layers.

The ILD layer 118 is formed between the bottom source/drain regions 122 and the top source/drain regions 124, and over the top of the top source/drain regions 124. The ILD layer 118 may be formed of any suitable isolating material, such as $SiO_2$, SiOC, SiON, etc. The ILD layer 118 has a width which matches that of the bottom source/drain regions 122 and the top source/drain regions 124.

The bottom source/drain regions 122 and the top source/drain regions 124, as noted above, may be formed using epitaxial growth processes, and thus may also be referred to as bottom epitaxial layers 122 and top epitaxial layers 124. The bottom source/drain regions 122 and the top source/drain regions 124 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain regions 122 and the top source/drain regions 124 may be formed using epitaxial growth processes. In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$.

The inner spacers 126 may be formed to fill indent spaces (e.g., resulting from indent etches of the sacrificial layers prior to their removal). The inner spacers 126 may be formed of silicon nitride (SiN) or another suitable material such as SiBCN, silicon carbide oxide (SiCO), SiOCN, etc.

The sidewall spacers 128 may be formed of materials similar to that of the dielectric insulator layers 116. The sidewall spacers 128 may have widths (in direction X-X) that are similar to the widths of the inner spacers 126.

FIGS. 2A and 2B illustrate semiconductor structure 100 at a second-intermediate fabrication stage. During this stage, an internal contact 129 for the top source/drain regions 124 and bottom source/drain regions 122 is formed in semiconductor structure 100 followed by deposition of dielectric cap 130. Internal contact 129 can be formed by depositing a material of a hard mask layer over the structure, followed by lithographic processing to result in a patterned hard mask layer. The material of the hard mask layer may include SiN, a multi-layer of SiN and SiO$_2$, or another suitable material. Once the hard mask layer is patterned, a cut is performed in the top source/drain regions 124, bottom source/drain regions 122 and ILD layer 118 to form an opening and a conductive metal is deposited in the opening to fill a portion of the opening to form internal contact 129. Suitable metals for internal contact 129 include any conductive material such as, for example, tungsten (W), aluminum (Al), copper (Cu), cobalt (Co), nickel (Ni), titanium (Ti), ruthenium (Ru), molybdenum (Mo), or any other suitable conductive material. In various embodiments, the internal contact 129 can be formed utilizing chemical vapor deposition (CVD), physical vapor deposition (PVD), atomic layer deposition (ALD) and/or plating.

The dielectric cap 130 may be obtained by filling a dielectric in the opening, followed by planarization using chemical mechanical planarization (CMP) or any other suitable planarization process. The hard mask layer can then be removed by any suitable etching technique. The material of the dielectric cap 130 can include a low-k dielectric material (e.g., materials having a small dielectric constant relative to silicon dioxide, i.e., less than about 3.9), porous silicates, carbon doped oxides, silicon dioxides, silicon nitrides, silicon oxynitrides, silicon carbide (SiC), or other dielectric materials. Any known manner of depositing the dielectric cap material in the remaining portion of the opening can be utilized, such as, for example, ALD, CVD, PVD, flowable CVD or spin-on dielectrics.

Figures 3A, 3B:
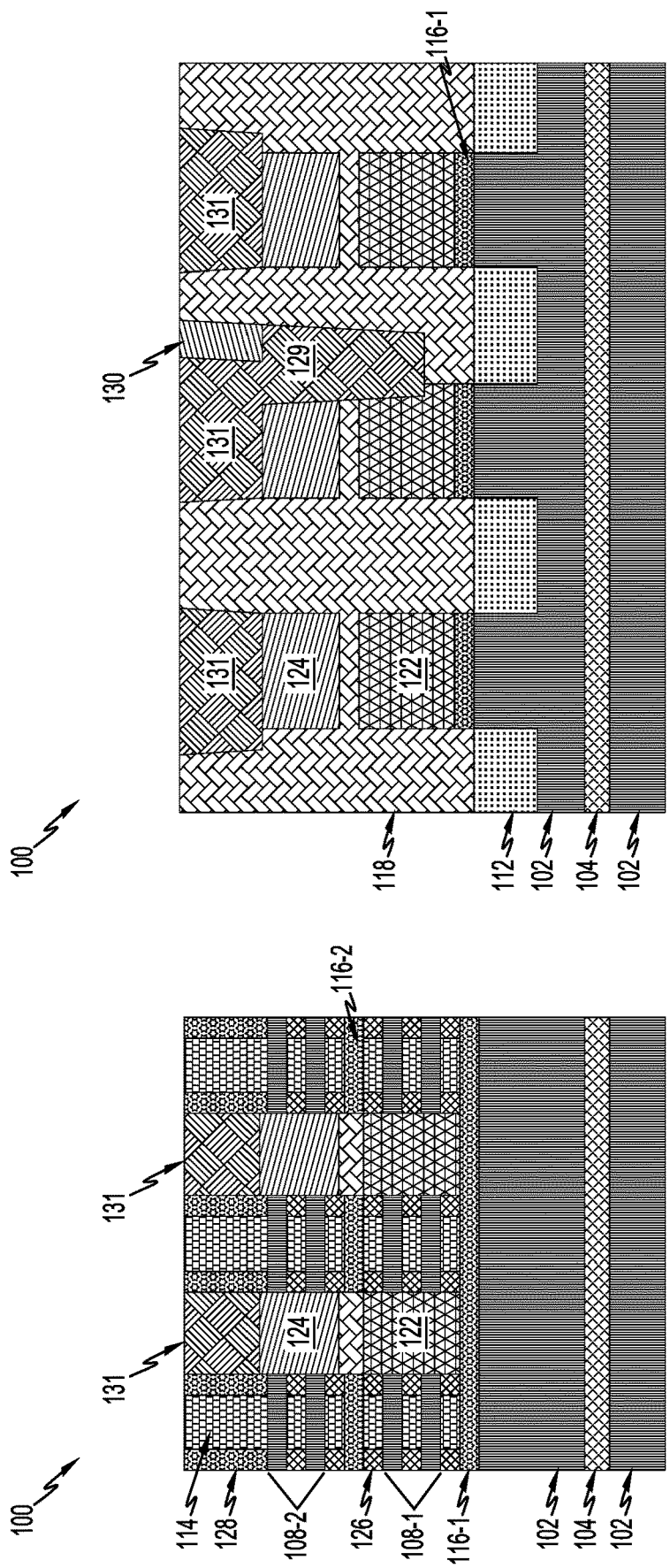
FIG. 3A is a cross-sectional view illustrating the semiconductor structure taken along the X-X axis of FIG. 1A at a third-intermediate fabrication stage, according to an illustrative embodiment.
FIG. 3B is a cross-sectional view illustrating the semiconductor structure taken along the Y-Y axis of FIG. 1A at the third-intermediate fabrication stage, according to an illustrative embodiment.

FIGS. 3A and 3B illustrate semiconductor structure 100 at a third-intermediate fabrication stage. During this stage, middle-of-the-line contacts followed by metallization are formed on top source/drain regions 124. For example, top source/drain contact 131 can be formed utilizing conventional lithographic and etching processes in at least ILD layer 118 and a portion of dielectric cap 130 to form a via. Next, a high conductance metal is deposited in the vias to form top source/drain contact 131. Suitable high conductance metals include any of those discussed above for internal contact 129. In various embodiments, the high conductance metal can be deposited by ALD, CVD, PVD, and/or plating. The high conductance metal can be planarized using, for example, a planarizing process such as CMP. Other planarization processes can include grinding and polishing.

Figures 4A, 4B:
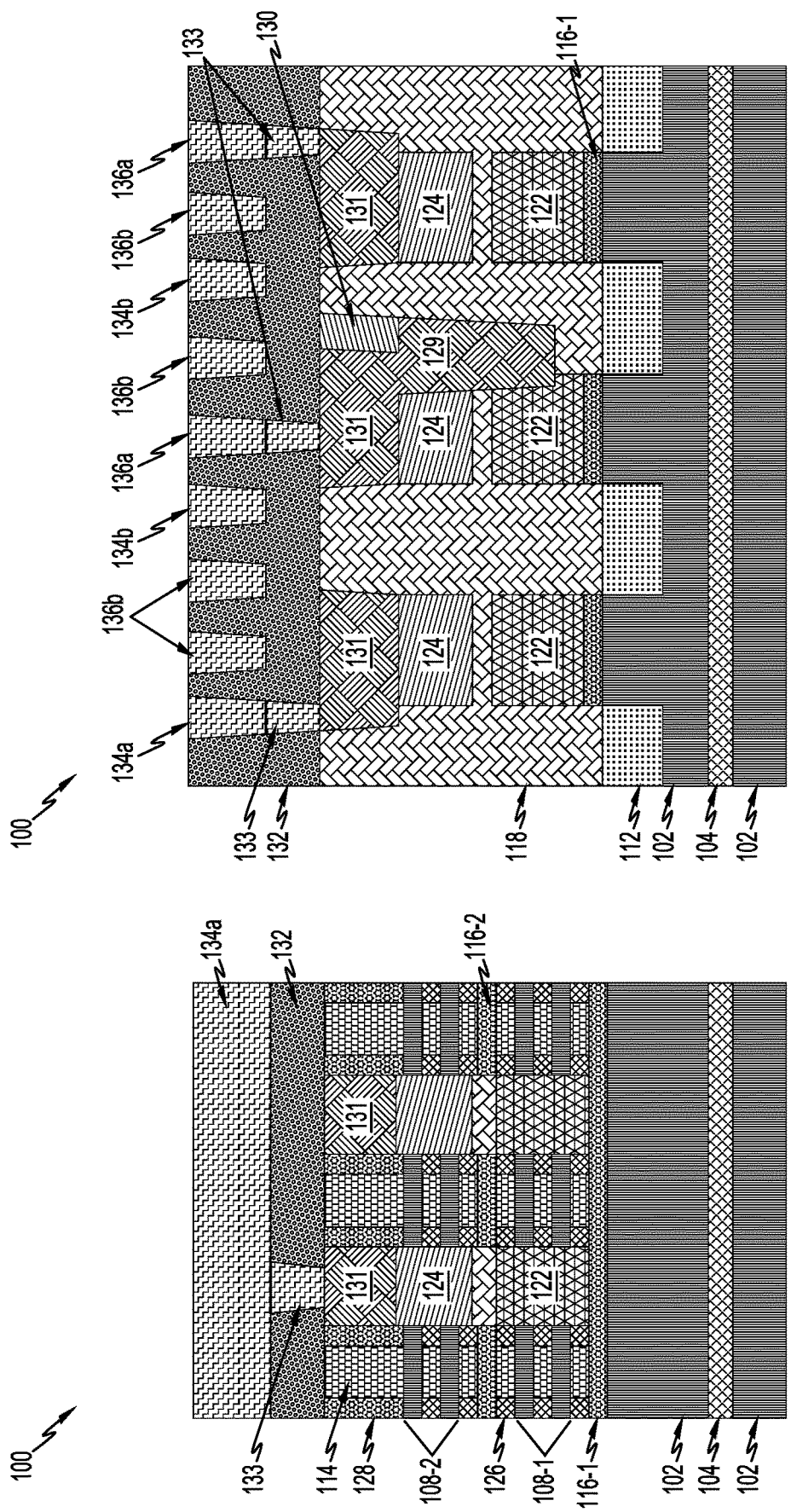
FIG. 4A is a cross-sectional view illustrating the semiconductor structure taken along the X-X axis of FIG. 1A at a fourth-intermediate fabrication stage, according to an illustrative embodiment.
FIG. 4B is a cross-sectional view illustrating the semiconductor structure taken along the Y-Y axis of FIG. 1A at the fourth-intermediate fabrication stage, according to an illustrative embodiment.

FIGS. 4A and 4B illustrate semiconductor structure 100 at a fourth-intermediate fabrication stage. During this stage, ILD layer 132 is first deposited on semiconductor structure 100, followed by patterning and etching vias in the exposed ILD layer 132. A suitable conductive metal is then deposited in the vias to form metal via 133 and can be any metal as discussed above for internal contact 129. A conductive line 134*a* is formed in ILD layer 132, the conductive line 134*a* being a power line connected to the semiconductor structure 100 through the metal via 133 and top source/drain contact 131. Power lines 134*b* are also formed in ILD layer 132. Conductive lines 136*a* are also formed in ILD layer 132, the conductive line 136*a* being signal lines electrically connected to the semiconductor structure 100 through the metal via 133 and top source/drain contact 131. Signal lines 136*b* are also formed in ILD layer 132.

FIGS. 5A and 5B illustrate semiconductor structure 100 at a fifth-intermediate fabrication stage. During this stage, front side back-end-of-line (BEOL) interconnect 138 is formed followed by bonding of the structure (e.g., the front side BEOL interconnect 138) to a carrier wafer 140. The front side BEOL interconnect 138 include various BEOL interconnect structures. For example, front side BEOL interconnect 138 is a metallization structure that includes one or more metal layers disposed on a side of semiconductor structure 100 opposite of the side on which the back side BEOL metallization structure is disposed. The metal layers of the front side BEOL interconnect 138 each have metal lines for making interconnections to the semiconductor device.

As discussed in more detail below, the front side BEOL interconnect 138 includes one or more metal layers that include metal lines for carrying power signals (e.g., a positive and/or negative voltage signal and/or ground signal) for providing power routing between the back side and the front side of the semiconductor structure 100. Power routing involves metal lines configured to carry a power signal. For example, the semiconductor structure 100 may require power to operate. In the example of FETs as semiconductor structure 100, a power signal may need to be coupled to a gate, source, and/or drain of the FET for its desired function and operation.

The carrier wafer 140 may be formed of materials similar to that of the substrate 102, and may be formed over the front side BEOL interconnect 138 using a wafer bonding process, such as dielectric-to-dielectric bonding.

Figures 6A, 6B:
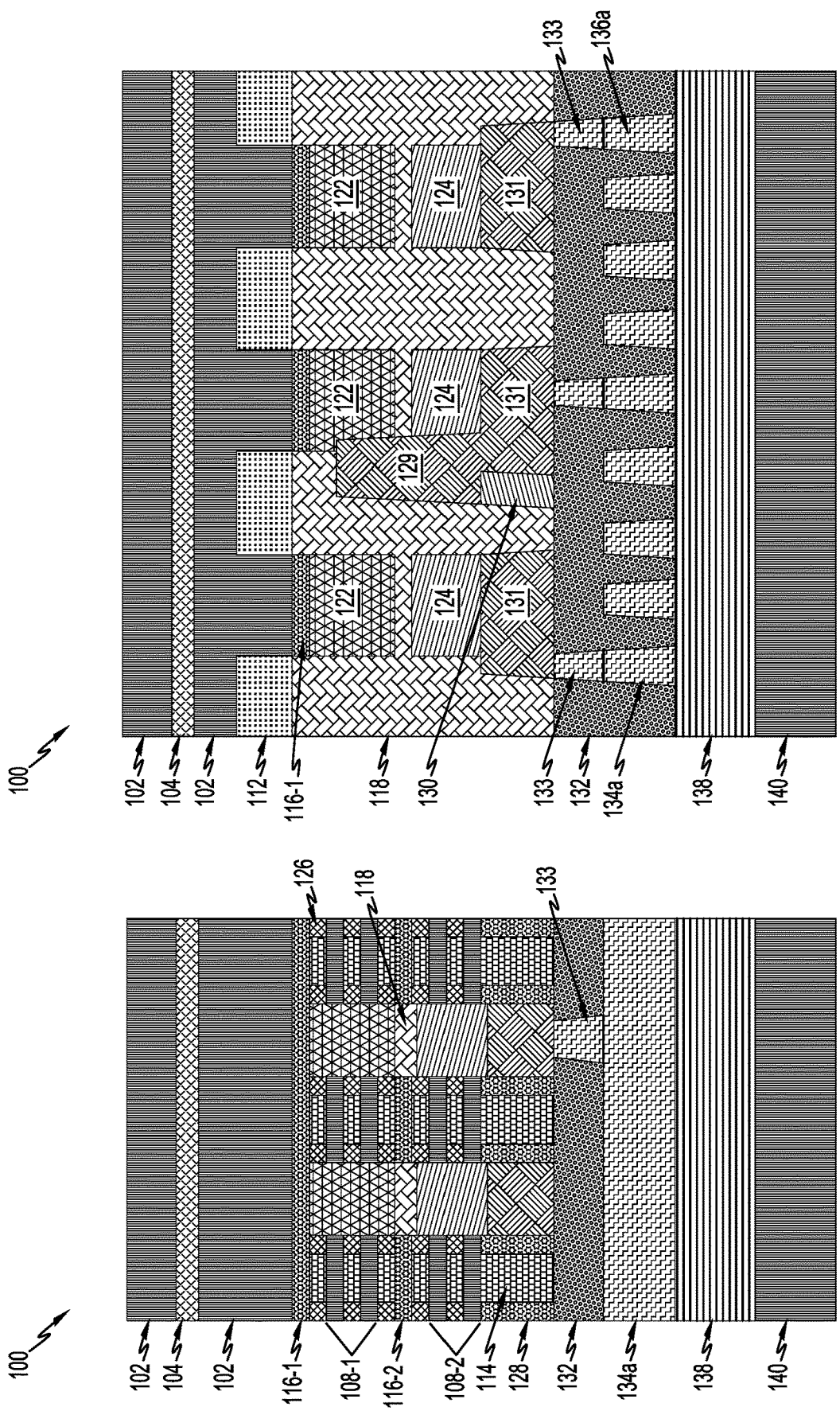
FIG. 6A is a cross-sectional view of the semiconductor structure taken along the X-X axis of FIG. 16A at a sixth-intermediate fabrication stage, according to an illustrative embodiment.
FIG. 6B is a cross-sectional view of the semiconductor structure taken along the Y-Y axis of FIG. 1A at the sixth-intermediate fabrication stage, according to an illustrative embodiment.

FIGS. 6A and 6B illustrate semiconductor structure 100 at a sixth-intermediate fabrication stage. During this stage, using the carrier wafer 140, the structure is "flipped" over so that the back side of the substrate 102 (i.e., the back surface) is facing up for back side processing as shown.

Figures 7A, 7B:
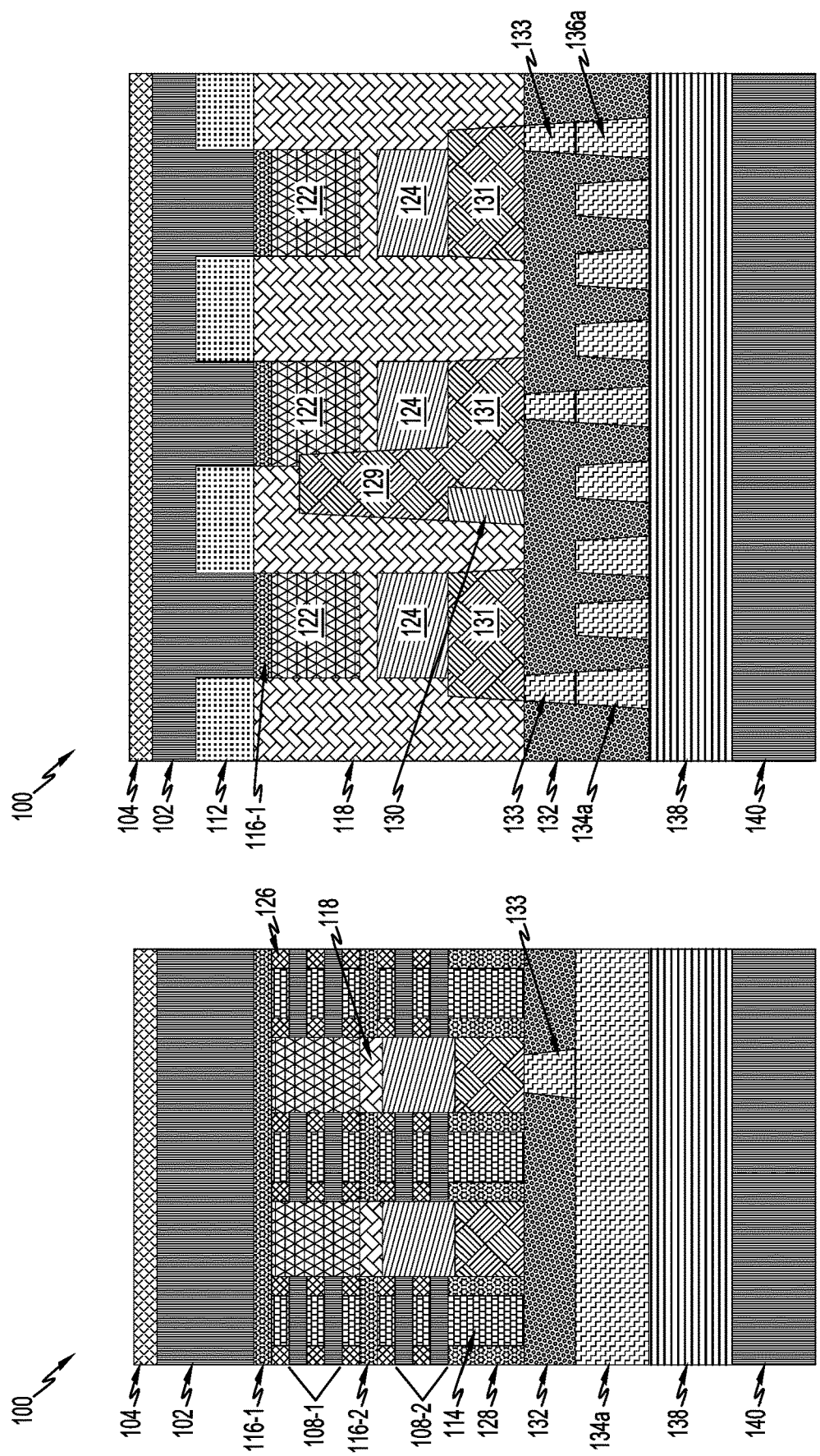
FIG. 7A is a cross-sectional view illustrating the semiconductor structure taken along the X-X axis of FIG. 1A at a seventh-intermediate fabrication stage, according to an illustrative embodiment.
FIG. 7B is a cross-sectional view illustrating the semiconductor structure taken along the Y-Y axis of FIG. 1A at the seventh-intermediate fabrication stage, according to an illustrative embodiment.

FIGS. 7A and 7B illustrate semiconductor structure 100 at a seventh-intermediate fabrication stage. During this stage, using the flipped structure, portions of the substrate 102 may be removed from the back side using, for example, a substrate grinding, a planarization (e.g., using CMP) and a wet etch to selectively remove substrate 102 until the etch stop layer 104 is reached.

FIGS. 8A and 8B illustrate semiconductor structure 100 at an eighth-intermediate fabrication stage. During this stage, the etch stop layer 104 is selectively removed using, for example, a wet etch to selectively remove etch stop layer 104 until substrate 102 is reached.

Figures 9A, 9B:
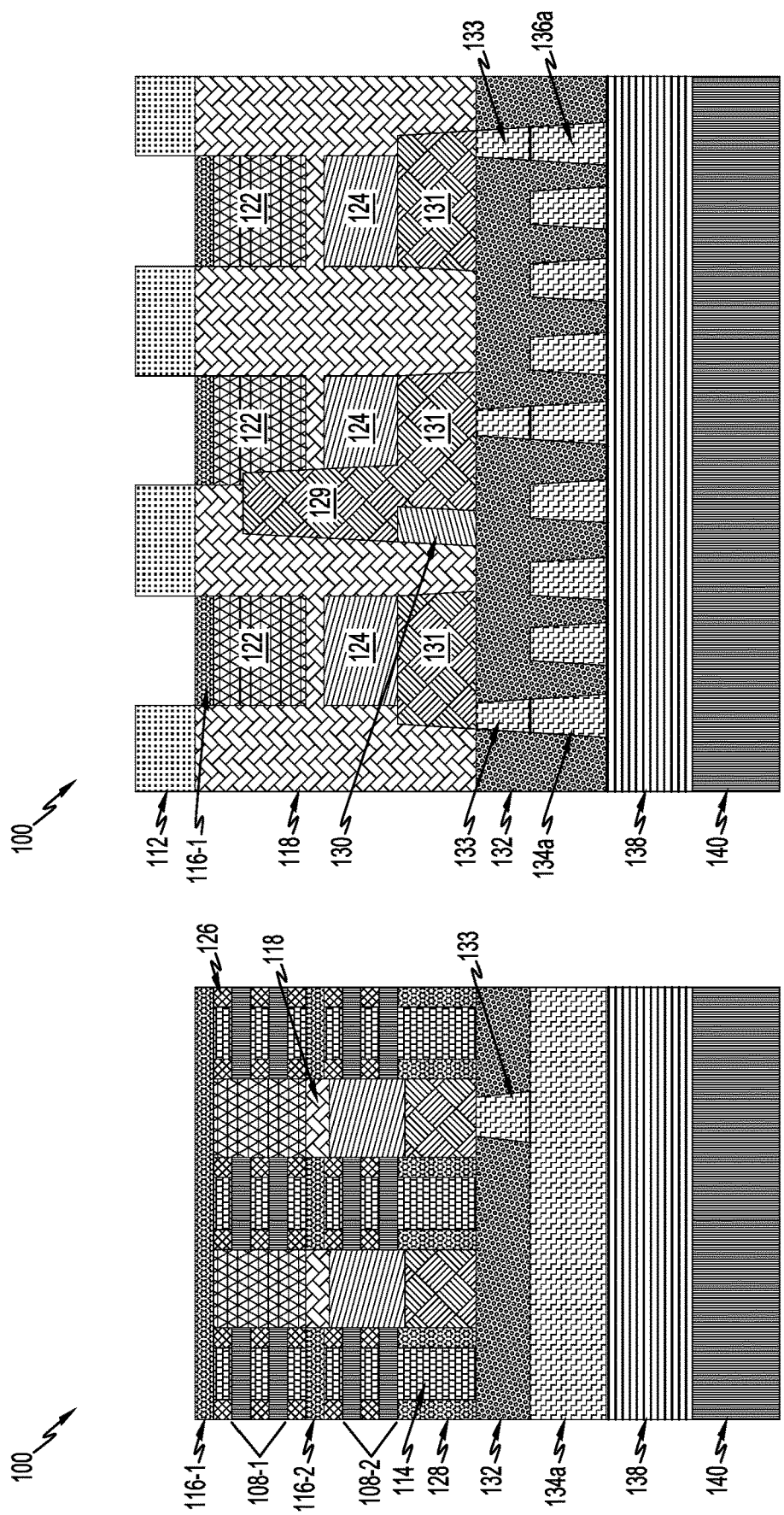
FIG. 9A is a cross-sectional view illustrating the semiconductor structure taken along the X-X axis of FIG. 1A at a ninth-intermediate fabrication stage, according to an illustrative embodiment.
FIG. 9B is a cross-sectional view illustrating the semiconductor structure taken along the Y-Y axis of FIG. 1A at the ninth-intermediate fabrication stage, according to an illustrative embodiment.

FIGS. 9A and 9B illustrate semiconductor structure 100 at a ninth-intermediate fabrication stage. During this stage, the remaining portions of the substrate 102 are removed to expose the BDI layer 116-1 and STI regions 112. The remaining portions of the substrate 102 can be removed utilizing a selective etch process such as a wet etch.

Figures 10A, 10B:
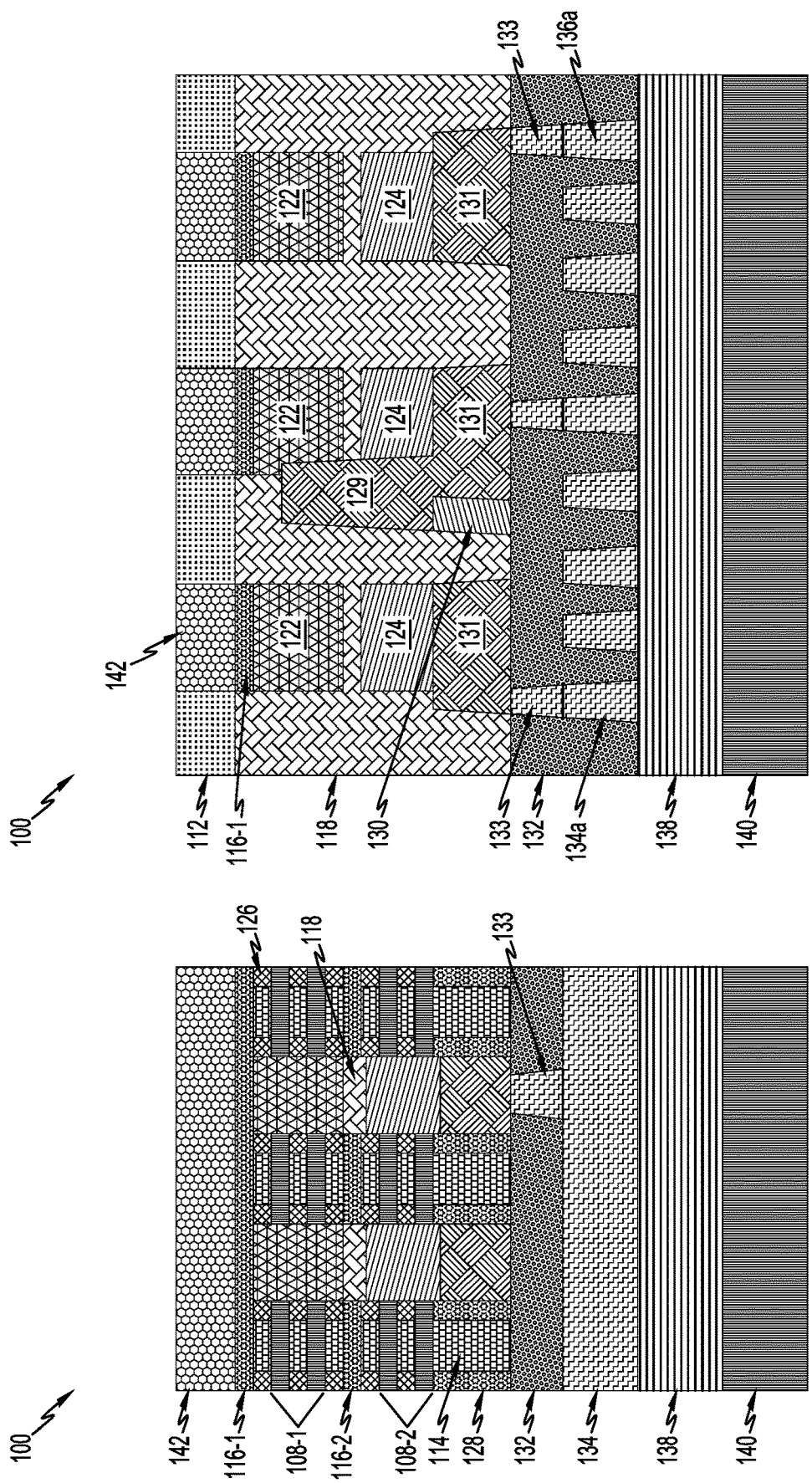
FIG. 10A is a cross-sectional view illustrating the semiconductor structure taken along the X-X axis of FIG. 1A at a tenth-intermediate fabrication stage, according to an illustrative embodiment.
FIG. 10B is a cross-sectional view illustrating the semiconductor structure taken along the Y-Y axis of FIG. 1A at the tenth-intermediate fabrication stage, according to an illustrative embodiment.

FIGS. 10A and 10B illustrate semiconductor structure 100 at a tenth-intermediate fabrication stage. During this stage, back side ILD layer 142 may be formed of similar materials as the ILD layer 118. The material of the back side ILD layer 142 may initially be overfilled, followed by planarization (e.g., using CMP) stopping on the STI regions 112 as shown.

FIGS. 11A and 11B illustrate semiconductor structure 100 at an eleventh-intermediate fabrication stage. During this stage, back side source/drain contacts 144 are formed in back side ILD layer 142 by patterning and etching vias in the exposed back side ILD layer 142. A suitable metal is then deposited in the vias formed by removing the exposed back side ILD layer 142. A suitable metal can be any of the metals discussed above for internal contact 129.

Figure 12B:
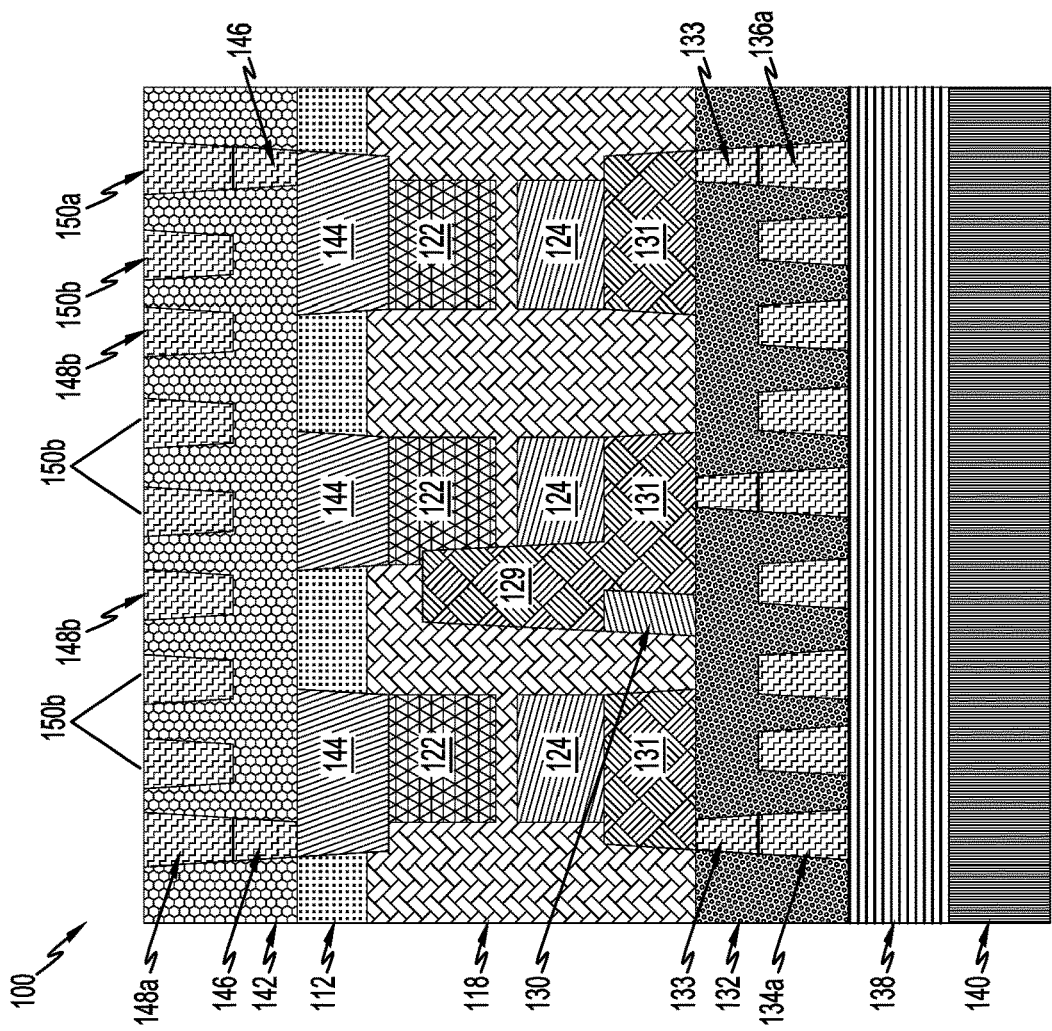
FIG. 12B is a cross-sectional view illustrating the semiconductor structure taken along the Y-Y axis of FIG. 1A at the twelfth-intermediate fabrication stage, according to an illustrative embodiment.
Figure 12A:
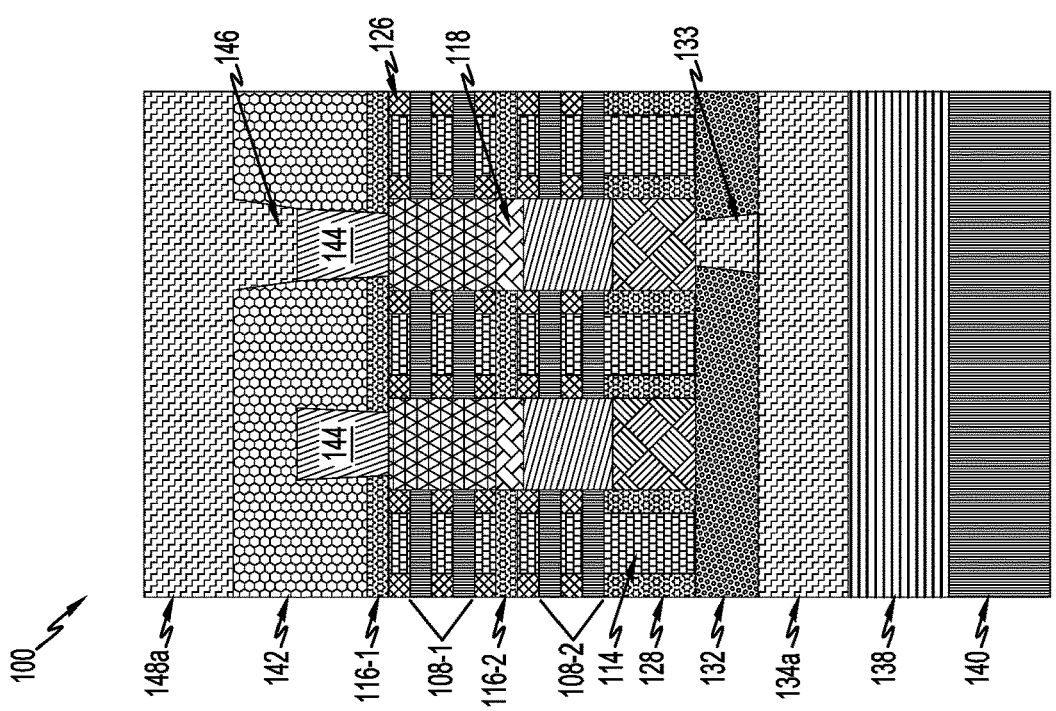
FIG. 12A is a cross-sectional view illustrating the semiconductor structure taken along the X-X axis of FIG. 1A at a twelfth-intermediate fabrication stage, according to an illustrative embodiment.

FIGS. 12A and 12B illustrate semiconductor structure 100 at a twelfth-intermediate fabrication stage. During this stage, an additional back side ILD layer 142 is deposited on semiconductor structure 100, followed by patterning and etching vias in the exposed back side ILD layer 142. A suitable conductive metal is then deposited in the vias to form metal via 146 and can be any metal as discussed above for internal contact 129. A conductive line 148*a* is formed in back side ILD layer 142, the conductive line 148*a* being a power line electrically connected to the semiconductor structure 100 through the metal via 146 and back side source/drain contacts 144. Power lines 148*b* are also formed in back side ILD layer 142. A conductive line 150*a* is also formed in back side ILD layer 142, the conductive line 150*a* being a signal line electrically connected to the semiconductor structure 100 through the metal via 146 and back side source/drain contacts 144. Signal lines 150*b* are also formed in back side ILD layer 142.

Figures 13A, 13B:
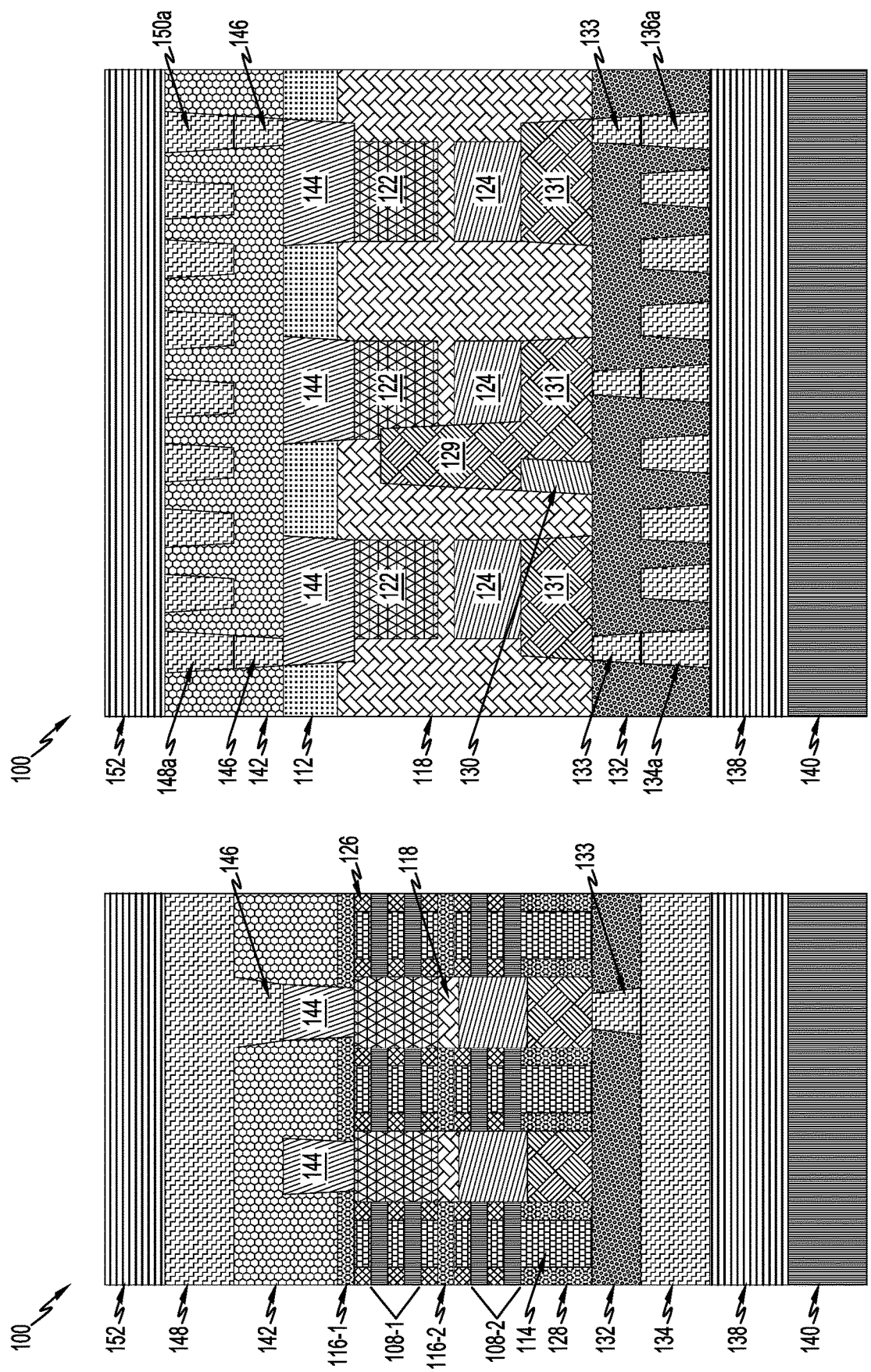
FIG. 13A is a cross-sectional view illustrating the semiconductor structure taken along the X-X axis of FIG. 1A at a thirteenth-intermediate fabrication stage, according to an illustrative embodiment.
FIG. 13B is a cross-sectional view illustrating the semiconductor structure taken along the Y-Y axis of FIG. 1A at the thirteenth-intermediate fabrication stage, according to an illustrative embodiment.

FIGS. 13A and 13B illustrate semiconductor structure 100 at a thirteenth-intermediate fabrication stage. During this stage, back side power delivery network 152 is formed over the structure. The power signals can be routed through back side power delivery network 152 containing metal lines coupled to the semiconductor structure to provide power to a number of semiconductor devices. Back side power delivery network 152 is formed over the structure including buried power lines and is based on creation of a wiring scheme that is disposed on both sides of the device layer (front end of line structure).

Figure 14:
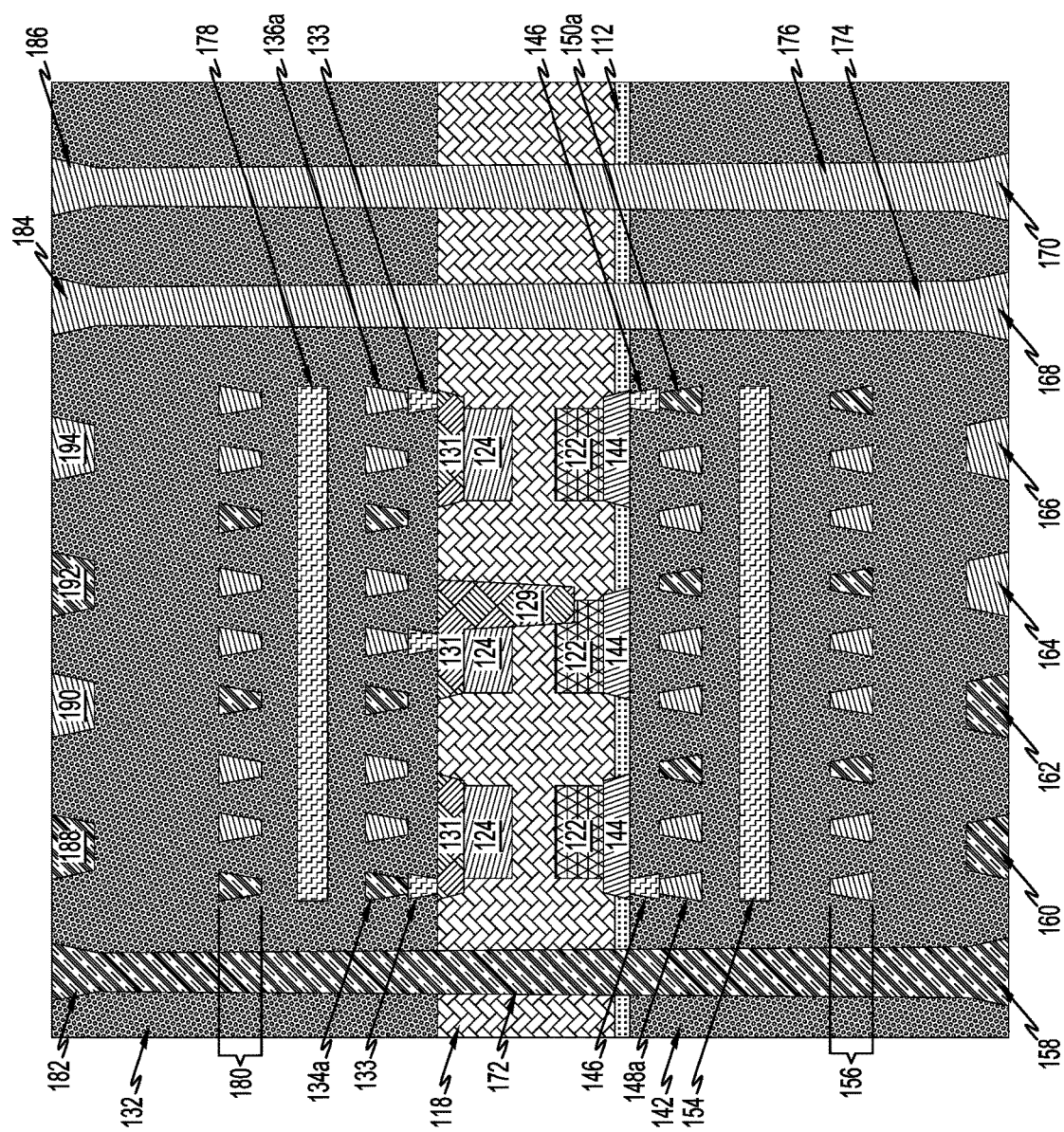
FIG. 14 is a cross-sectional view illustrating the semiconductor structure taken along the Y-Y axis of FIG. 1A at the fourteenth-intermediate fabrication stage, according to an illustrative embodiment.

FIG. 14 illustrates semiconductor structure 100 at a fourteenth-intermediate fabrication stage. During this stage, both back side and front side processing are performed on semiconductor structure 100. In particular, back side power delivery network 152 of FIG. 13B includes layers of a back side multi-layer interconnect. For example, the additional layers can include metallization layers such as M2 and M3 identified as layers 154 and 156, respectively, in additionally deposited back side ILD layer 142. The formation of the additional back side ILD layer 142 may include deposition and CMP in some embodiments. These metallization layers can provide for in some implementations, ground (GND or Vss) lines as well as conductive lines. The additional layers can also include metallization layers up to an Mx layer which contains ground (GND or Vss) lines 160 and 162 as well as conductive lines 164 and 166. The back side power delivery network 152 can further include back side power (Vdd) line 158 and back side signal lines 168 and 170. For example, the back side ILD layer 142 may be patterned to form trenches corresponding to the back side lines (e.g., Vss and Vdd lines) and signal lines. The conductive lines may include Ti, TiN, TaN, Co, W, Al, Cu, combinations thereof and other suitable materials.

In addition, front side BEOL interconnect 138 of FIG. 13B also includes layers of a front side multi-layer interconnect. For example, the additional layers can include metallization layers such as M2 and M3 identified as layers 178 and 180, respectively, in additionally deposited ILD layer 132. The formation of the additional ILD layer 132 may include deposition and CMP in some embodiments. These metallization layers can provide for in some implementations, ground (GND or Vss) lines as well as conductive lines. The additional layers can also include metallization layers up to an Mx layer which contains ground (GND or Vss) lines 188 and 192 as well as conductive lines 190 and 194. The front side BEOL interconnect 138 can further include front side power (Vdd) rail 182 and front side signal lines 184 and 186. For example, the ILD layer 132 may be patterned to form trenches corresponding to the front side lines (e.g., Vss and Vdd lines) and signal lines. The conductive lines may include Ti, TiN, TaN, Co, W, Al, Cu, combinations thereof. and other suitable materials. The front side power line 182 is electrically connected to back side power line 158 by way of an interconnect structure 172 such as, for example, a via or set of vias, to connect the power (Vdd) rail from back side power delivery network 152 to front side BEOL interconnect 138. The front side signal lines 184 and 186 are electrically connected to respective back side signal lines 168 and 170 by way of respective interconnect structures 174 and 176 such as, for example, a via or set of vias, to connect the signal from back side power delivery network 152 to front side BEOL interconnect 138.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first field-effect transistor comprising:
 a first back side source/drain contact;
 a second back side source/drain contact;
 a first power line and a first signal line each connected to the first back side source/drain contact and the second back side source/drain contact, respectively;
 a back-end-of-line layer on a back side of the first field-effect transistor; and
 a second power line connected to the back-end-of-line layer on the back side of the first field-effect transistor; and
a second field-effect transistor vertically stacked above the first field-effect transistor, the second field-effect transistor comprising:
 a first front side source/drain contact;
 a second front side source/drain contact;
 a first power line and a first signal line each connected to the first front side source/drain contact and the second front side source/drain contact, respectively;
 a back-end-of-line layer on a front side of the second field-effect transistor; and
 a second power line connected to the back-end-of-line layer on the front side of the second field-effect transistor; and
the second power line of the first field-effect transistor being connected to the second power line of the second field-effect transistor by a first interconnect structure.

2. The semiconductor structure of claim 1, wherein:
the first field-effect transistor further comprises a first source/drain region disposed on the first back side source/drain contact and a second source/drain region disposed on the second back side source/drain contact;
the second field-effect transistor further comprises a first source/drain region disposed on the first front side source/drain contact and a second source/drain region disposed on the second front side source/drain contact;
the first source/drain region of the second field-effect transistor being stacked above the first source/drain region of the first field-effect transistor; and
the second source/drain region of the second field-effect transistor being stacked above the second source/drain region of the first field-effect transistor.

3. The semiconductor structure of claim 2, wherein:
the first field-effect transistor further comprises a third source/drain region;
the second field-effect transistor further comprises a third source/drain region; and the third source/drain region of the second field-effect transistor is stacked above the third source/drain region of the first field-effect transistor.

4. The semiconductor structure of claim 3, further comprising a metal contact disposed on each of the third source/drain region of the second field-effect transistor and the third source/drain region of the first field-effect transistor.

5. The semiconductor structure of claim 1, wherein the first power line and the first signal line of the first field-effect transistor are disposed within a first dielectric layer.

6. The semiconductor structure of claim 5, wherein the first power line and the first signal line of the second field-effect transistor are disposed within a second dielectric layer.

7. The semiconductor structure of claim 1, wherein:
the first field-effect transistor further comprises a second signal line connected to the back-end-of-line layer on the back side;
the second field-effect transistor further comprises a second signal line connected to the back-end-of-line layer on the front side; and
the second signal line of the first field-effect transistor being connected to the second signal line of the second field-effect transistor by a second interconnect structure.

8. The semiconductor structure of claim 1, wherein the first field-effect transistor and the second field-effect transistor comprise respective nanosheet field-effect transistor devices.

9. An integrated circuit, comprising:
one or more semiconductor structures, wherein at least one of the one or more semiconductor structures comprises:
a first field-effect transistor comprising:
 a first back side source/drain contact;
 a second back side source/drain contact;
 a first power line and a first signal line each connected to the first back side source/drain contact and the second back side source/drain contact, respectively;
 a back-end-of-line layer on a back side of the first field-effect transistor; and
 a second power line connected to the back-end-of-line layer on the back side of the first field-effect transistor; and
a second field-effect transistor vertically stacked above the first field-effect transistor, the second field-effect transistor comprising:
 a first front side source/drain contact;
 a second front side source/drain contact;
 a first power line and a first signal line each connected to the first front side source/drain contact and the second front side source/drain contact, respectively
 a back-end-of-line layer on a front side of the second field-effect transistor; and
 a second power line connected to the back-end-of-line layer on the front side of the second field-effect transistor; and
the second power line of the first field-effect transistor being connected to the second power line of the second field-effect transistor by a first interconnect structure.

10. The integrated circuit of claim 9, wherein:
the first field-effect transistor further comprises a first source/drain region disposed on the first back side source/drain contact and a second source/drain region disposed on the second back side source/drain contact;
the second field-effect transistor further comprises a first source/drain region disposed on the first front side source/drain contact and a second source/drain region disposed on the second front side source/drain contact;

the first source/drain region of the second field-effect transistor being stacked above the first source/drain region of the first field-effect transistor; and the second source/drain region of the second field-effect transistor being stacked above the second source/drain region of the first field-effect transistor.

11. The integrated circuit of claim 10, wherein:

the first field-effect transistor further comprises a third source/drain region;

the second field-effect transistor further comprises a third source/drain region; and the third source/drain region of the second field-effect transistor is stacked above the third source/drain region of the first field-effect transistor.

12. The integrated circuit of claim 11, further comprising a metal contact disposed on each of the third source/drain region of the second field-effect transistor and the third source/drain region of the first field-effect transistor.

13. The integrated circuit of claim 9, wherein the first power line and the first signal line of the first field-effect transistor are disposed within a first dielectric layer.

14. The integrated circuit of claim 13, wherein the first power line and the first signal line of the second field-effect transistor are disposed within a second dielectric layer.

15. The integrated circuit of claim 9, wherein:

the first field-effect transistor further comprises a second signal line connected to the back-end-of-line layer on the back side;

the second field-effect transistor further comprises a second signal line connected to the back-end-of-line layer on the front side; and the second signal line of the first field-effect transistor being connected to the second signal line of the second field-effect transistor by a second interconnect structure.

16. The integrated circuit of claim 9, wherein the first field-effect transistor and the second field-effect transistor comprise respective nanosheet field-effect transistor devices.

17. A method, comprising:

forming a first field-effect transistor comprising a first back side source/drain contact; a second back side source/drain contact; a first power line and a first signal line each connected to the first back side source/drain contact and the second back side source/drain contact, respectively;

forming a back-end-of-line layer on a back side of the first field-effect transistor; and a second power line connected to the back-end-of-line layer on the back side of the first field-effect transistor; and forming a second field-effect transistor vertically stacked above the first field-effect transistor, the second field-effect transistor comprising a first front side source/drain contact; a second front side source/drain contact; a first power line and a first signal line each connected to the first front side source/drain contact and the second front side source/drain contact, respectively;

forming a back-end-of-line layer on a front side of the second field-effect transistor; and a second power line connected to the back-end-of-line layer on the front side of the second field-effect transistor; and connecting the second power line of the first field-effect transistor to the second power line of the second field-effect transistor by a first interconnect structure.

18. The method of claim 17, further comprising:

forming a second signal line connected to the back-end-of-line layer on the back side of the first field-effect transistor;

forming a second signal line connected to the back-end-of-line layer on the front side of the second field-effect transistor; and forming a second interconnect structure connecting the second signal line of the first field-effect transistor to the second signal line of the second field-effect transistor.

19. The method of claim 17, further comprising:

forming a first source/drain region disposed on the first back side source/drain contact of the first field-effect transistor and a second source/drain region disposed on the second back side source/drain contact of the first field-effect transistor;

forming a first source/drain region disposed on the first front side source/drain contact of the second field-effect transistor and a second source/drain region disposed on the second front side source/drain contact of the second field-effect transistor.

20. The method of claim 19, wherein:

the first source/drain region of the second field-effect transistor is stacked above the first source/drain region of the first field-effect transistor; and the second source/drain region of the second field-effect transistor is stacked above the second source/drain region of the first field-effect transistor.

* * * * *